(12) United States Patent
Shi et al.

(10) Patent No.: US 10,938,395 B2
(45) Date of Patent: *Mar. 2, 2021

(54) ELECTRONIC DEVICE WITH A TIMING ADJUSTMENT MECHANISM

(71) Applicant: Micron Technology, Inc., Boise, ID (US)

(72) Inventors: Dan Shi, Folsom, CA (US); Tyler J. Gomm, Boise, ID (US); Michael J. Allen, Rescue, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,465

(22) Filed: Mar. 4, 2020

(65) Prior Publication Data

US 2020/0204182 A1    Jun. 25, 2020

Related U.S. Application Data

(63) Continuation of application No. 16/566,703, filed on Sep. 10, 2019, now Pat. No. 10,623,004, which is a continuation of application No. 16/103,822, filed on Aug. 14, 2018, now Pat. No. 10,454,484.

(51) Int. Cl.
| | |
|---|---|
| *H03L 7/08* | (2006.01) |
| *H03L 7/081* | (2006.01) |
| *G11C 11/4076* | (2006.01) |
| *H03K 19/20* | (2006.01) |
| *G11C 11/4074* | (2006.01) |
| *G11C 11/408* | (2006.01) |

(52) U.S. Cl.
CPC ........ *H03L 7/0802* (2013.01); *G11C 11/4076* (2013.01); *H03K 19/20* (2013.01); *H03L 7/0812* (2013.01); *G11C 11/4074* (2013.01); *G11C 11/4087* (2013.01)

(58) Field of Classification Search
CPC . H03L 7/0802; H03L 7/0812; G11C 11/4076; G11C 11/4074; G11C 11/4087; H03K 19/20
USPC ..................................................... 365/189.05
See application file for complete search history.

(56) References Cited

U.S. PATENT DOCUMENTS

| | | | |
|---|---|---|---|
| 7,443,216 B2 | 10/2008 | Gomm et al. | |
| 7,728,639 B2 * | 6/2010 | Gomm .................. | H03L 7/0814 327/149 |
| 9,077,350 B2 * | 7/2015 | Na .......................... | G11C 7/222 |

(Continued)

FOREIGN PATENT DOCUMENTS

CN           107872221 A    4/2018

OTHER PUBLICATIONS

Lee, H.-W. et al., "A 1.0-ns/1.0-V Delay-Locked Loop With Racing Mode and Countered CAS Latency Controller for DRAM Interfaces", IEEE Journal of Solid-State Circuits (vol. 47, Issue: 6, Jun. 2012), pp. 1436-1447. DOI: 10.1109/JSSC.2012.2191027.

*Primary Examiner* — Fernando Hidalgo
(74) *Attorney, Agent, or Firm* — Perkins Coie LLP

(57) ABSTRACT

An electronic device including: a delay circuit configured to adjust a delay of an input for generating an output signal; and an input selection circuit coupled to the delay circuit, the input selection circuit configured to control a phase for a clock input based at least in part on a measurement of a delay corresponding to the delay circuit in generating the input.

26 Claims, 9 Drawing Sheets

(56) References Cited

U.S. PATENT DOCUMENTS

| | | | |
|---|---|---|---|
| 10,270,453 B2 * | 4/2019 | Wei | ........................ H03L 7/0814 |
| 10,454,484 B1 | 10/2019 | Shi et al. | |
| 2017/0155412 A1 * | 6/2017 | Cho | ........................ H04L 25/03 |
| 2017/0288683 A1 | 10/2017 | Wei et al. | |

* cited by examiner

ELECTRONIC DEVICE WITH A TIMING ADJUSTMENT MECHANISM

CROSS-REFERENCE TO RELATED APPLICATION(S)

This application is a continuation of U.S. application Ser. No. 16/566,703, filed Sep. 10, 2019; which is a continuation of U.S. application Ser. No. 16/103,822, filed Aug. 14, 2018, now U.S. Pat. No. 10,454,484; each of which is incorporated herein by reference in its entirety.

TECHNICAL FIELD

The disclosed embodiments relate to electronic devices, and, in particular, to semiconductor devices with a timing adjustment mechanism.

BACKGROUND

Electronic devices, such as semiconductor devices, memory chips (e.g., dynamic random-access memory (DRAM) devices), microprocessor chips, and imager chips, can include one or more timing circuits. For example, the electronic devices, such as semiconductor dies, can include one or more delay locked loops (DLL) in an input/output (IO) circuit configured to process external and internal clock signals. The DLL generally operates to generate a stable output signal from an input signal (e.g., clock signal). The DLL can generate the output signal based on controlling/adjusting phase (e.g., time delay) of the externally provided input signal.

The DLL can include a delay line configured to provide variable adjustments to the phase of the input signal. However, in traditional DLL, the delay line can consume relatively large amounts of power, both active and standby. Further, the delay line can be a major source of clock jitter. In some traditional designs, the delay line can provide a relatively large (e.g., relative to other components within the DLL or the clock circuit) impact to the total power consumption of the IO circuit. The power consumption can increase at lower data rates, since longer delay line may be activated to support the lower data rate.

DETAILED DESCRIPTION

The technology disclosed herein relates to electronic devices (e.g., semiconductor-level devices, memory devices, etc.), systems with electronic devices, and related methods of operation or manufacture for the electronic devices that initialize a timing alignment/adjustment process for signals. In some embodiments, the electronic devices, such as memory devices (e.g., DRAM) illustrated in FIG. 1, can include an IO circuit configured to process clock signals. For example, the electronic devices can include a clock input circuit or an internal clock circuit configured to generate one or more internal signals (e.g., clock signals) based on an externally-provided clock signal. The clock circuit can include a DLL that includes a variable delay line configured to provide variable adjustments to the input signals in generating the internal signals.

The clock circuit can include an initialization circuit configured to initially determine an adjustment amount, such as for the phase of the input signal, for the DLL and/or the variable delay line therein. In determining the adjustment amount, the electronic devices can invert the input signal before the variable delay line instead of delaying the input signal beyond a 180-degree phase shift. Based on inverting the input signal and limiting the phase shift to less than 180 degrees, the electronic devices can reduce or minimize the length of the variable delay line in generating the internal signals. In some embodiments, the electronic devices can be configured to determine an inversion decision during the DLL initialization process. In other words, the decision to invert the input clock signal can be made internal within the electronic devices during the DLL initialization process, such as using the DLL initialization circuit. Accordingly, the electronic devices can determine an accurate delay amount (e.g., an amount that minimizes the variable delay line length) without increasing the circuit size. As such, determining the inversion decision as part of the DLL initialization process can reduce the power consumed by the variable delay line without increasing the design complexity.

Figure 1:
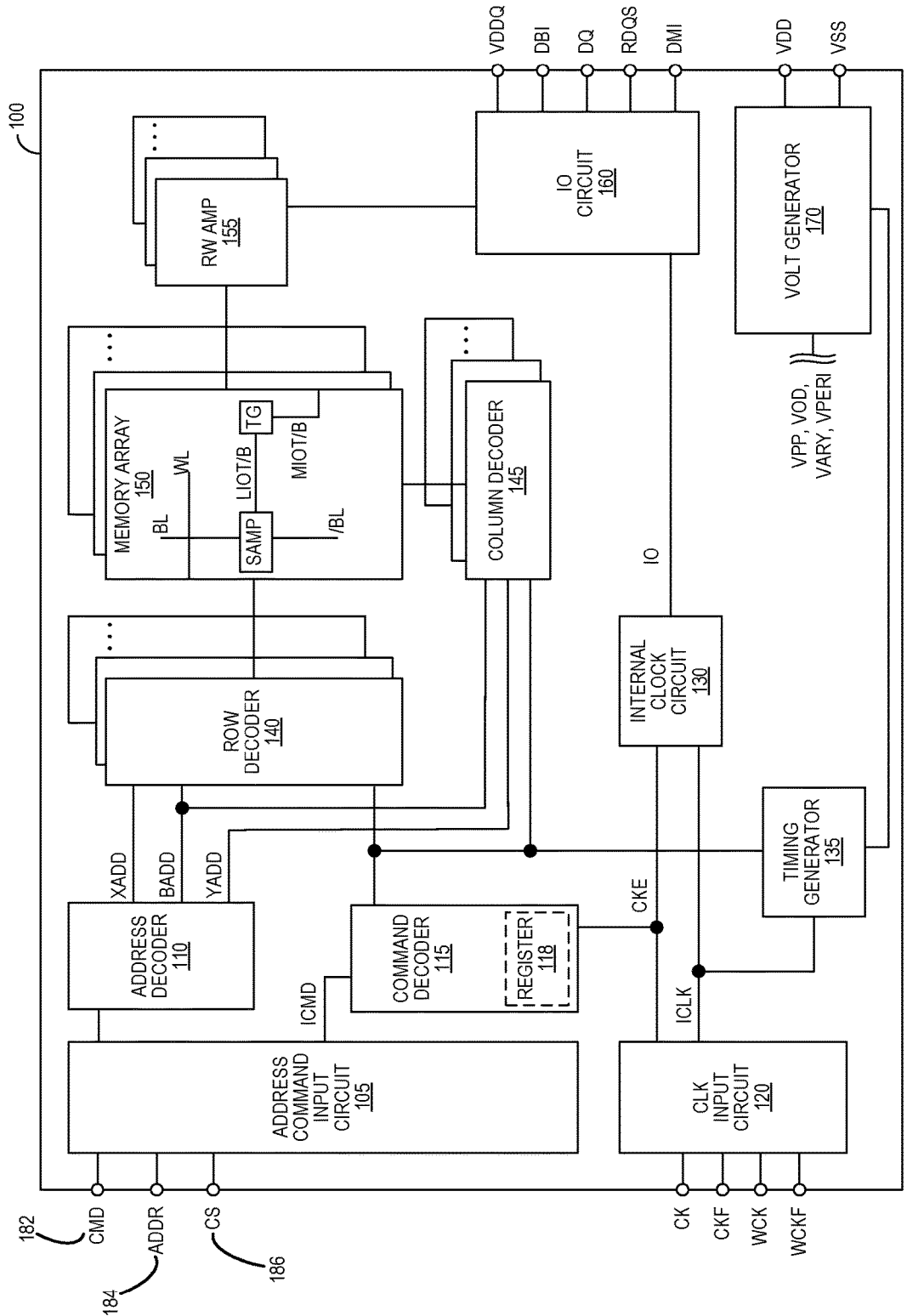
FIG. 1 is a block diagram of a memory device in accordance with an embodiment of the present technology.

FIG. 1 is a block diagram of a memory device 100 (e.g., a semiconductor memory device, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals 182 (CMD) and address signals 184 (ADDR), respectively. The memory device may further include a chip select terminal to receive a chip select signal 186 (CS), clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal 184 and a bank address signal from outside. The address signal 184 and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals 182 (CMD), address signals 184 (ADDR), and chip select signals 186 (CS), from a memory controller. The command signals 182 may represent various memory commands from the memory controller (e.g., including access commands, which can include read commands and write commands). The select signal 186 may be used to select the memory device 100 to respond to commands 182 and addresses 184 provided to the command and address terminals. When an active chip select signal 186 is provided to the memory device 100, the commands 182 and addresses 184 can be decoded and memory operations can be performed. The command signals 182 may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. For example, the clock input circuit 120 can include a DLL configured to adjust the phase of the external clock signals in generating the internal clock signals. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

In some embodiments, the clock input circuit 120 can include an initialization circuit configured to initially determine a phase adjustment (e.g., time delay) amount for the DLL. For example, the initialization circuit can determine a length for the variable delay line that provides the phase adjustment to the external input clock. The initialization circuit can be further configured to determine whether to invert the input signal to the DLL as part of the initialization process. In other words, while determining the variable delay line length, the initialization circuit can make the decision to the invert the external input clock instead of delaying the signal beyond 180 degrees.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
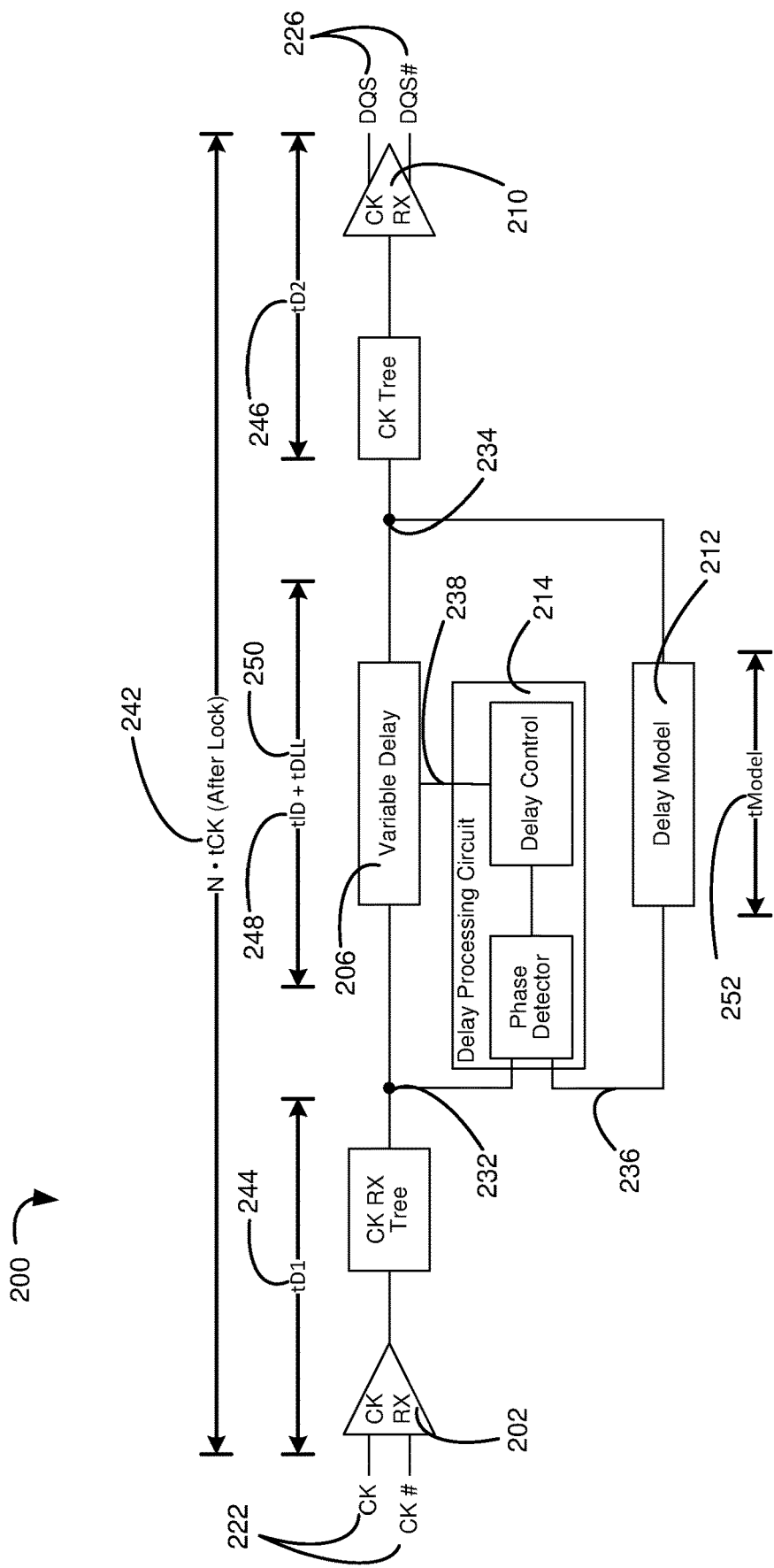
FIG. 2 is a block diagram of an example clock distribution circuit in accordance with an embodiment of the present technology.

FIG. 2 illustrates an example clock distribution circuit (e.g., an initialization circuit, a DLL, or a combination thereof) 200. The clock distribution circuit 200 can be configured to initialize the DLL. For example, the clock distribution circuit 200 can determine an initial phase adjustment or delay amount (e.g., a length of the variable delay line). In some embodiments, the clock distribution circuit 200 can be included in the clock input circuit 120 of FIG. 1.

The clock distribution circuit 200 can include an input buffer 202, a variable delay circuit 206 (e.g., the variable delay line), an output buffer 210, a delay model 212, a delay processing circuit 214, etc. The input buffer 202 is configured to receive one or more input signals, such as an external input clock (CK) 222 and/or an inverse thereof (CK #), from a source external to the clock distribution 200. The input buffer 202 can be coupled to the variable delay circuit 206 that is configured to provide variable amount of delay to the input clock 222. The variable delay circuit 206 can generate one or more output signals 226, such as internal clock signals (e.g., a data strobe (DQS) signal or an inverse thereof (DQS #)).

The variable delay circuit 206 can generate the output signal 226 based on the output from the input buffer 202 (e.g., an input delayed signal 232), a processed result thereof, a feedback output of the variable delay circuit 206 (e.g., a variable delay output 234), a processed result thereof, or a combination thereof. For example, the input buffer 202 may cause delay to the input clock 222 and generate the input delayed signal 232. The variable delay circuit 206 can generate the variable delay output 234 based on further delaying the input delayed signal 232. The variable delay circuit 206 can determine a variable amount of delay for the input delayed signal 232 based on a feedback of the variable delay output 234. The feedback of the variable delay output 234 can be processed/affected by the delay model 212. The delay model 212 can represent delays associated with circuits outside of the loop, such as the input buffer 202, output buffers 210, clock distribution network (CK RX Tree after the input buffer 202 and CK Tree after the variable delay circuit 206), etc. The processed/affected output according to the delay model 212 can be a model delayed signal 236, which can be processed by the delay processing circuit 214. The delay processing circuit 214 (e.g., a phase detector, a trim adjustment circuit, etc.) can receive and compare the model delayed signal 236 and the input delayed signal 232. For example, the delay processing circuit 214 can determine a relative position/timing of the model delayed signal 236 and the input delayed signal 232. The delay processing circuit 214 can generate a variable control signal 238 according to the comparison, and the variable delay circuit 206 can control the amount of delay based on the variable control signal 238.

The overall delay introduced by the clock distribution circuit 200 can be an after-lock timing duration 242 (NICK). The after-lock timing duration 242 (N·tCK) can be a multiple (N) of a period (tCK) of the input clock 222. The after-lock timing duration 242 can also be a sum/combination of a first duration 244 (tD1), a second duration 246 (tD2), an intrinsic delay 248 (tID), a variable line delay 250 (tDLL), etc. For example, the after-lock timing duration 242 can be represented as:

$$N \cdot tCK = tD1 + tD2 + tID + tDLL. \qquad \text{Equation (1).}$$

The first duration 244 can be the delay caused/introduced by the input buffer 202 and CK RX Tree after the input buffer 202. The second duration 246 can be the delay caused/introduced by CK Tree and the output buffer 210. The total delay of the first duration 244 and the second duration 246 can be matched with a model delay 252 (tModel) associated with the delay model 212. For example, the model delay 252 can be represented as:

$$tModel = tD1 + tD2. \qquad \text{Equation (2).}$$

The intrinsic delay 248 can be the delay inherently caused/introduced by the variable delay circuit 206. For example, the intrinsic delay 248 can be a minimum required amount of delay from the variable delay circuit 206. The variable line delay 250 can be the delay duration additionally caused/introduced by the variable delay circuit 206.

Figure 3:
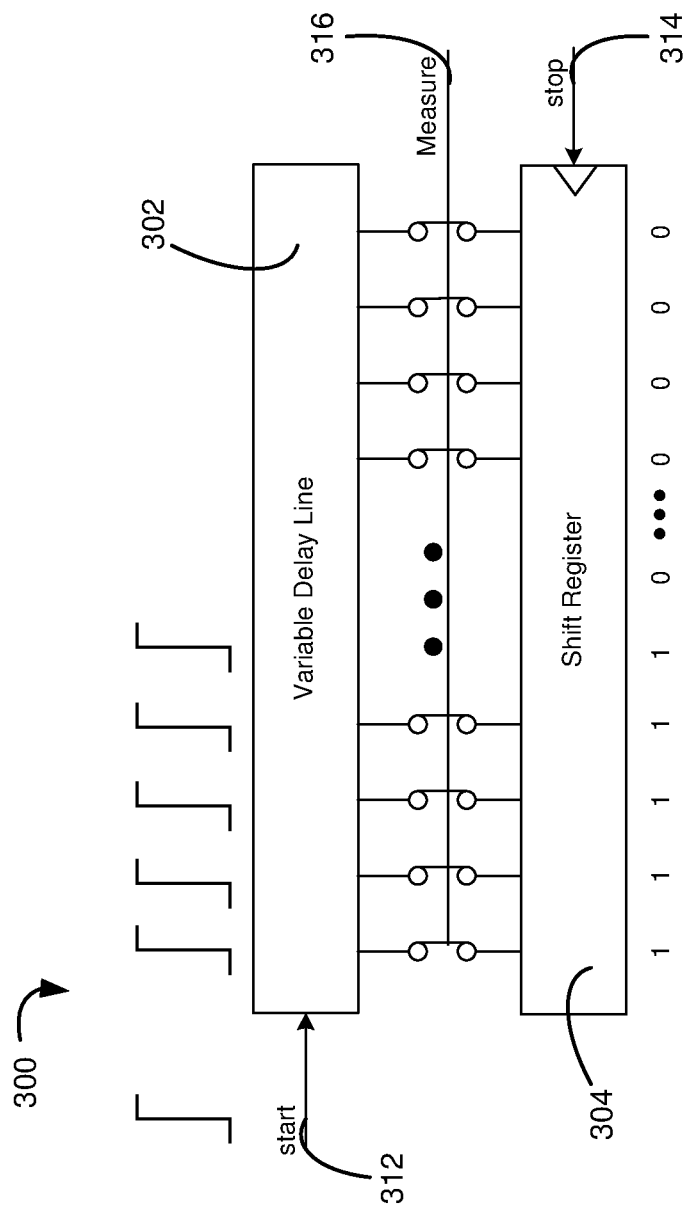
FIG. 3 is a block diagram of an initialization process in accordance with an embodiment of the present technology.

FIG. 3 illustrates an initialization process 300. The initialization process 300 can initialize the variable delay circuit 206 of FIG. 2 (e.g., the DLL). The initialization process 300 can initialize a variable delay line 302 (e.g., the variable delay circuit 206) using a shift register 304 (e.g., a set of latches or Flip-Flops), etc. In some embodiments, the initialization process 300 can be implemented by the clock distribution circuit 200 of FIG. 2 or the variable delay circuit 206.

The initialization process 300 can include receiving a start signal 312 and a stop signal 314. The start signal 312 can be an edge (e.g., a rising edge) of the input clock 222 used to start the initialization process 300. The start signal 312 can be inserted into the variable delay line 302. Once inserted, the start signal 312 can propagate through stages in the variable delay line 302 until the stop signal 314 arrives. As the start signal 312 propagates the value/location of the stages can be tapped and passed to the shift register 304. When the stop signal 314 arrives, the amount of start signal propagation can be captured in the shift register 304. For example, the initialization process 300 can operate similar to a stop watch using the start signal 312 and the stop signal 314.

An initialization logic (not shown in FIG. 3) can generate a measure signal 316 representing a measurement phase of DLL. The measurement signal 316 can be high during the measurement process, which can be used to close the switches such that the variable delay line 302 tapped values can pass through and become latched by the shift register 304 when the stop signal 314 arrives. The measure signal 316 can be used to determine an initial delay value for the DLL locking process.

Figure 4:
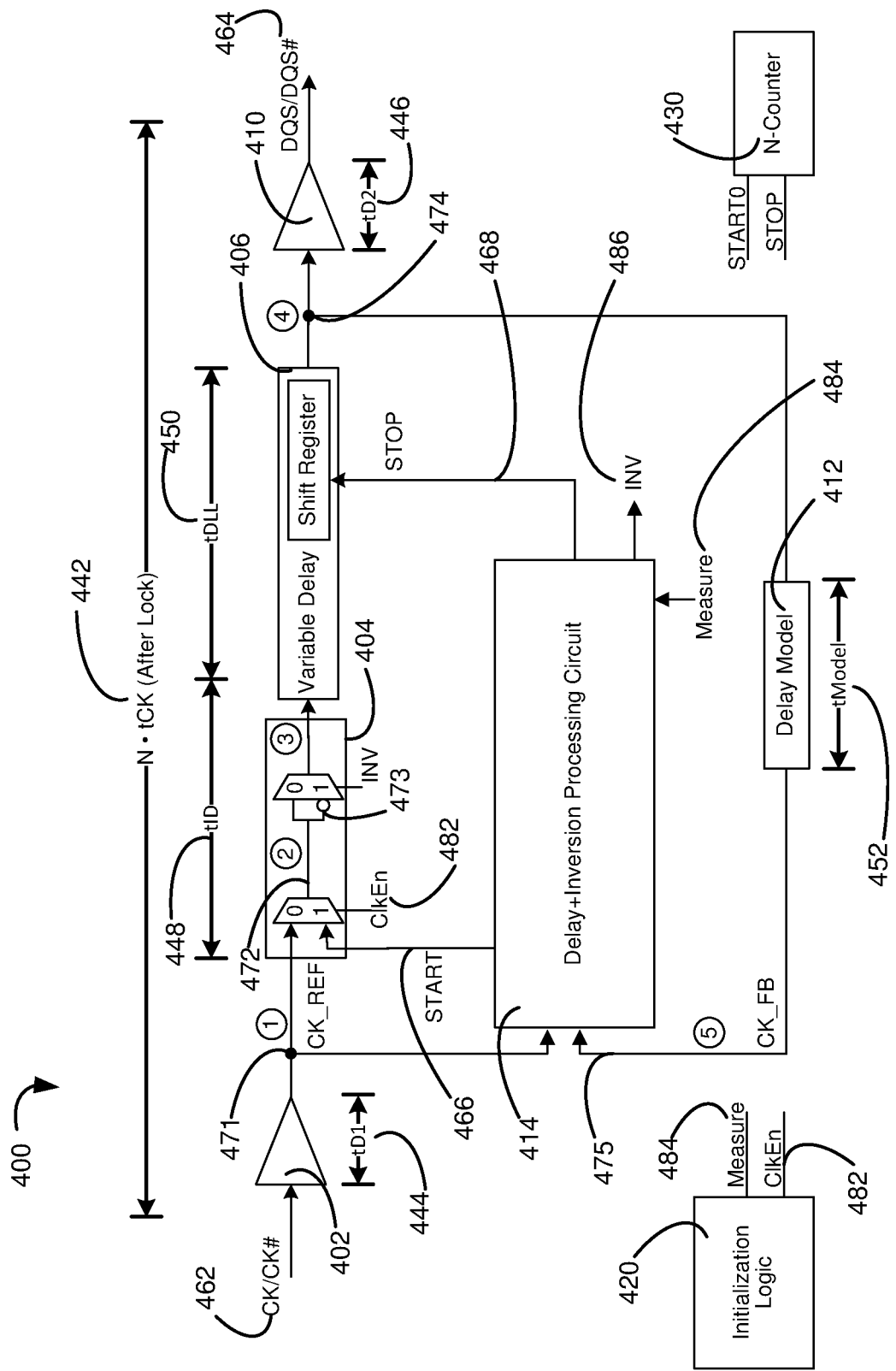
FIG. 4 is a circuit diagram of an electronic device in accordance with an embodiment of the present technology.

FIG. 4 is a circuit diagram of an electronic device 400 (e.g., a semiconductor die/device, such as for a dynamic random-access memory (DRAM)) in accordance with an embodiment of the present technology. The electronic device 400 can include a clock distribution circuit, a DLL, an initialization circuit, etc.

FIG. 4 can illustrate the electronic device 400 that includes a clock distribution circuit that is additionally configured to make the input inversion decision during the DLL initialization process. The electronic device 400 can include circuitry to invert the input clock signal instead of configuring the variable delay line to phase shift the input signal beyond 180 degrees. The electronic device 400 can include such circuitry that is integral with the determination of the initialization process (e.g., the process to initially determine the phase shift or the length of the variable delay line).

The electronic device 400 can include an input buffer 402, an input selector circuit 404, a variable delay circuit 406, an output buffer 410, a delay model 412, a decision circuit 414 (e.g., a delay-and-inversion processing circuit), etc. The input buffer 402, the input selector circuit 404, the variable delay circuit 406, the output buffer 410, the delay model 412 or an implementation thereof, the decision circuit 414, etc. can be electrically coupled to each other, either directly or indirectly. For example, an output portion/port of the input buffer 402 can be directly coupled (e.g., using connectors, such as wires, traces, bus, etc.) to input portions/ports of the input selector circuit 404 and/or the decision circuit 414. The output portion/port of the input selector circuit 404 can be directly coupled to the variable delay circuit 406 and/or the decision circuit 414. The output of the variable delay circuit 406 can be directly coupled to the output buffer 410 and/or the delay model 412 or an implementation thereof. The output after implementing the delay model 412 can be directly coupled to the decision circuit 414.

The input buffer 402 can receive one or more input signals 462, such as an external input clock (CK) and/or an inverse thereof (CK #), from a source external to the electronic device 400. The input buffer 402 can generate a clock reference signal 471 (CLK_REF), which can be delayed by a first duration 444 (tD1) in comparison to the input signal 462. The clock reference signal 471 can be passed to the input selector circuit 404.

The input selector circuit 404 can be configured to determine whether to use the provided signal or the inverted version thereof. For example, the input selector circuit 404 can generate a start-enabled signal 472 (e.g., corresponding to the clock reference signal 471) or an inverted signal 473 (e.g., inversion of the start-enabled signal 472, the clock reference signal 471, etc.) based on various inputs/processing results (e.g., a start signal 466, a clock enable 482 (ClkEn), an inversion-decision signal 486, etc.). The generated output of the input selector circuit 404 (e.g., the start-enabled signal 472 or the inverted signal 473) can correspond to an intrinsic delay 448 (tID) in comparison to the clock reference signal 471. The intrinsic delay 448 can include delay from the input selector circuit 404, delay from the variable delay 406 (e.g., when coarse code is equal to 0), etc. The output of the input selector circuit 404 be provided as an input to the variable delay circuit 406.

The variable delay circuit 406 can be configured to provide variable amount of delay to the input signal 462 and generate a variable delay output 474. The variable delay circuit 406 can adjust/delay the timing of the propagating signal according to coarse code value from initialization circuits. For example, a coarse code value (e.g., the variable delay output 474) can be generated based on a shift register (e.g., the shift register 304 of FIG. 3) latching coarse code values according to a stop signal 468 from the decision circuit 414. The resulting variable delay output 474 can correspond to a variable line delay 450 (tDLL) in comparison to the output of the input selector circuit 404. The variable delay output 474 can be provided to the output buffer 410 that uses the input to generate one or more output signals 464, such as a data strobe (DQS) or an inverse thereof (DQS #), that is delayed/locked in comparison to the input signals 462. The variable delay output 474 can also be further processed through a feedback loop and be provided as a processed input for generating the output signal 464. For example, the variable delay output 474 can be provided as an input to the delay model 412.

The delay model 412 can represent timing delays associated with circuits in the clock path (e.g., the input buffer 402, the input selector circuit 404, the output buffer 410, etc.) outside of the DLL (e.g., the variable delay circuit 206). The delay model 412 can generate a model delayed signal 475 (CK_FB) that corresponds to a model delay 452 (tModel). The model delay 452 can represent delay corresponding to the circuits outside of the DLL. For example, the model delay 452 can be based on the first duration 444 caused by the input buffer 402 and a second duration 446 (tD2) caused by the output buffer 410. The model delayed signal 475 can be routed to the decision circuit 414.

The decision circuit 414 can receive the clock reference signal 471 along with the model delayed signal 475. The decision circuit 414 can generate the start signal 466, the stop signal 468, an inversion-decision signal 486, etc. used to control the timing adjustment/delay for the DLL. For example, the decision circuit 414 can be configured to select either a signal synced/corresponding (e.g., 360° offset) to the input signal or an inverse (e.g., 180° offset) thereof that arrives first at a decision point. Accordingly, the decision circuit 414 can generate the inversion-decision signal 486.

As an illustrative example, for the first iteration/propagation through the feedback loop, the decision circuit 414 can use the model delayed signal 475, such as based on latching and/or delaying the model delayed signal 475, to generate the start signal 466. The first iteration/propagation can correspond to an 180° offset/delay of the signal, such as for the inverse signal. A subsequent iteration/propagation through the feedback loop can correspond to a 360° offset/delay of the signal, such as for the synchronized input signal. The decision circuit 414 can compare which of the synchronized or inversed signal arrives first. Based on the first-arriving of the two signals, the decision circuit 414 can generate stop signal 468.

The electronic device 400 can further include an initialization circuit 420. The initialization circuit 420 can be coupled (e.g., via direct connection) to the input selector circuit 404, the decision circuit 414, etc. The initialization logic circuit 420 can be configured to generate control logic signals (e.g., the clock enable 482, a measure signal 484, etc.).

The electronic device 400 can further include a timing counter 430. The timing counter 430 can be coupled (e.g., via direct connection) to the decision circuit 414. The timing counter 430 can be configured to count/measure multiples (N) of the completed signal periods/cycles for the clock reference signal 471. Accordingly, the electronic device 400 can generate the output signal 464 that corresponds to an after-lock timing 442 relative to the input signal 462. The after-lock timing 442 can be based on multiples (N) of the clock period (tCK), as represented in Equation (1).

Figure 5:
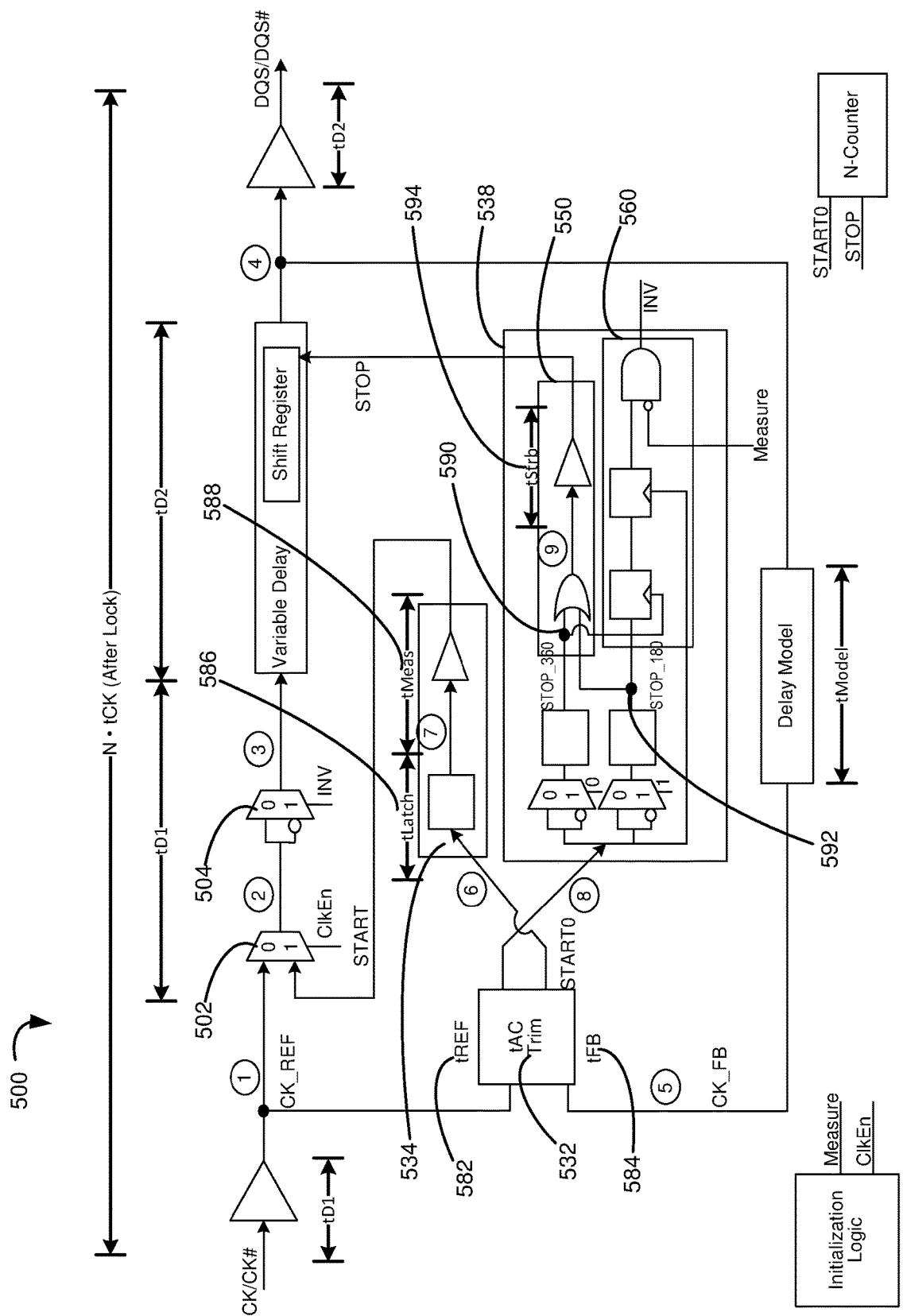
FIG. 5 is a circuit diagram of an electronic device in accordance with an embodiment of the present technology.

FIG. 5 is a circuit diagram of an electronic device 500 in accordance with an embodiment of the present technology. FIG. 5 can illustrate a detailed example of the electronic device 400 of FIG. 4. In some embodiments, the electronic device 500 can include the input selector circuit 404 of FIG. 4 that further includes a first input selector 502 and a second input selector 504.

The first input selector 502 can be configured to control a type of input for a variable delay circuit (e.g., the variable delay circuit 406 of FIG. 4, VDL, etc.). For example, the first input selector 502 can select the clock reference signal 471 of FIG. 4 or the start signal 466 of FIG. 4 as an input to the variable delay circuit. The first input selector 502 can select based on the clock enable 482 of FIG. 4. For example, a '0' value/state of the clock enable 482 can be used to select the clock reference signal 471 and a '1' value/state of the clock enable can be used to select the start signal 466.

The second input selector 504 can be configured to control a phase of the input for the variable delay circuit. The second input selector 504 can invert (e.g., 180° phase shift) the input to the variable delay circuit. For example, the second input selector 504 can let the start-enabled signal 472 of FIG. 4 pass through or invert the start-enabled signal 472 to generate the inverted signal 473 of FIG. 4. The second input selector 504 can control the phase based on the inversion-decision signal 486 of FIG. 4. For example, the second input selector 504 can maintain the phase or output of a synchronized signal (e.g., relative to the clock reference signal 471 and/or the input signal 462 of FIG. 4) when the inversion-decision signal 486 is low or '0'. Also, the second input selector 504 can output the inverted signal 473 when the inversion-decision signal 486 is high/one.

In some embodiments, the electronic device 500 can include the decision circuit 414 of FIG. 4 that further includes circuits/modules/devices/etc. configured to adjust the incoming signals, generate the start signal 466, generate the stop signal 468 of FIG. 4, generate the inversion-decision signal 486, etc. For example, the decision circuit 414 can include a trim circuit 532, a start generator 534, a timing processing circuit 538, etc.

The trim circuit 532 can be configured to adjust the incoming signals. For example, the trim circuit 532 can adjust the clock reference signal 471, such as for generating the stop signal 468 and/or the inversion-decision signal 486. The trim circuit 532 can trim the clock reference signal 471 by a reference trim 582 (tREF). Also, the trim circuit 532 can adjust the model delayed signal 475, such as for generating the start signal 466. The trim circuit 532 can trim the model delayed signal 475 by a feedback trim 584 (tFB). The resulting signal can be labeled an internal start signal (e.g., START0) that can be used to start the N-counter (e.g., the timing counter 430 of FIG. 4).

The start generator 534 can be configured to generate the start signal 466. The start generator 534 can generate the start signal 466 based on the internal start signal. In some embodiments, the start generator 534 can include a start latch and a start buffer. The start latch can introduce a latch duration 586 (e.g., a delay) to the internal start signal. Afterwards, the start buffer can introduce a measurement duration 588 (e.g., another delay). The result (e.g., output of the start latch) can be the start signal 466. As illustrated in FIG. 5, the electronic device 500 can output the start signal 466 as the start-enabled signal 472 of FIG. 4 based on a corresponding value (e.g., high or logic value of '1') of the clock enable 482.

The timing processing circuit 538 can be configured to generate the stop signal 468 and the inversion-decision signal 486. The timing processing circuit 538 can include a pre-processing circuit for generating the stop signal 468 and the inversion-decision signal 486. For example, the timing processing circuit 538 can include a first circuit (e.g., a first multiplexer, such as for reducing delay/duty cycle mismatch, and a first latch) and a second circuit (e.g., a second multiplexer, such as for reducing delay/duty cycle mismatch, and a second latch) configured to generate different internal signals. The first circuit can be configured to generate a synced-internal stop 590 (STOP_360) that is synchronized with the clock reference signal 471. In some embodiments, the first circuit can generate the synced-internal stop 590 based on triggering on a rising edge of the clock reference signal 471 or a trimmed result thereof. Also, the second circuit can be configured to generate an inverted-internal stop 592 (STOP_180) that is inverted (e.g., 180° offset) from the clock reference signal 471. The second circuit can generate the inverted-internal stop 592 based on triggering on a falling edge of the clock reference signal 471 or a trimmed result thereof. The first and the second circuits can generate the internal stop signals after the start signal 466 is generated.

In some embodiments, the timing processing circuit 538 can include a stop generator 550 configured to generate the stop signal 468. The stop generator 550 can include a stop decision mechanism (e.g., an OR gate) configured to compare the two internal stop signals (e.g., the synced-internal stop 590 and the inverted-internal stop 592) and use a faster of the two to generate the stop signal 468.

In some embodiments, the timing processing circuit 538 can include an inversion-decision circuit 560 configured to generate the inversion-decision signal 486. The inversion-decision circuit 560 can include a set of decision timers (e.g., first and second flip-flops) configured to sample the value of the inverted-internal stop 592 at a rising edge of the synced-internal stop 590 (e.g., at the first flip flop) and resynchronize the result with the clock reference signal 471 (e.g., at a second flip flop). A final synchronized value is released to an inverse decision mechanism (e.g., an AND gate) configured to release the final value as the inversion-decision signal 486 when the measure signal 484 goes low (e.g., after initialization is done). The inversion-decision signal 486 can be passed to the second multiplexer of the input selector circuit 404, which can select either the start-enabled signal 472 or the inverted signal 473 as its output based on the inversion-decision signal 486.

For the initialization process, the electronic device (e.g., the electronic device 400 of FIG. 4) can receive the input signal 462 (CK/CK #) by a clock receiver (e.g., the input buffer 402), which can generate the clock reference signal 471 after the first duration 444 (tD1). Based on the clock reference signal 471, the electronic device can generate the model delayed signal 475 after the intrinsic delay 448 and the model delay 452. The model delayed signal 475 can be processed by the trim circuit 532, and afterwards, a rising edge of the model delayed signal 475 can trigger the start signal 466 through the latch in the start generator 534. Further, the clock reference signal 471 can be processed by the trim circuit 532 and then trigger two internal stop signals (e.g., the inverted-internal stop 592 (STOP_180) and the synced-internal stop 590 (STOP_360)) through the latches. The timing processing circuit 538 can generate the inverted-internal stop 592, the synced-internal stop 590, the inversion-decision signal 486, and the stop signal 468, etc. as discussed above.

Figure 6:
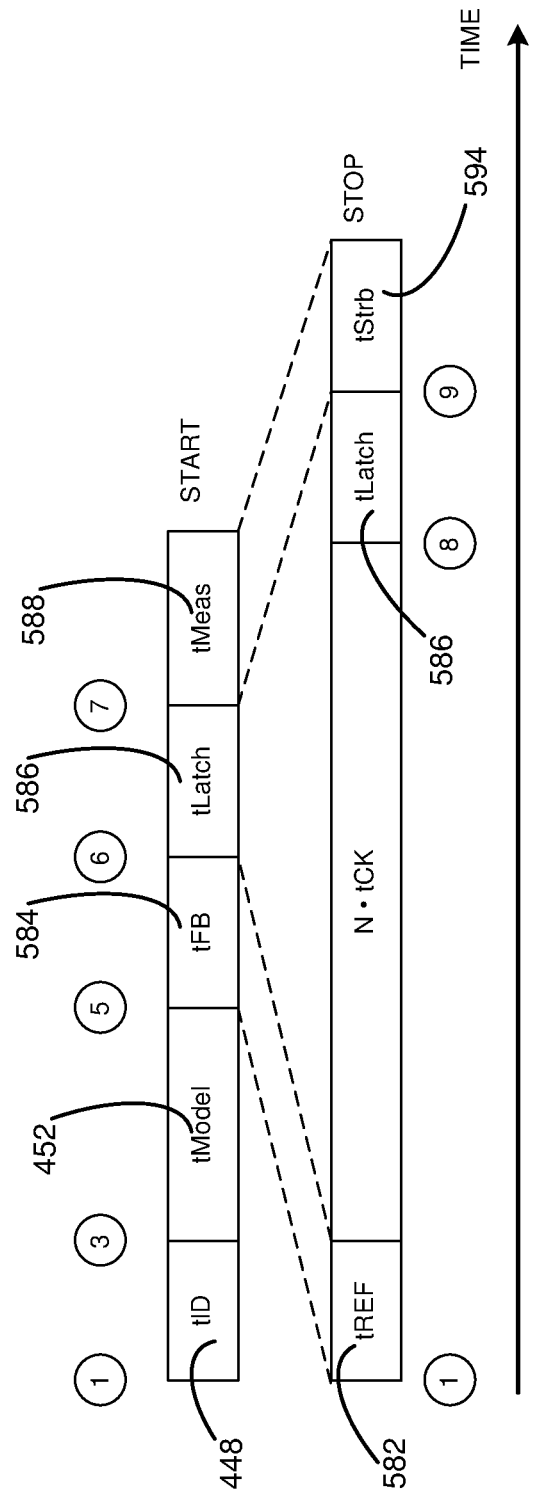
FIG. 6 illustrates a detailed example of timing signals in accordance with an embodiment of the present technology.

FIG. 6 illustrates a detailed example of timing signals in accordance with an embodiment of the present technology. FIG. 6 can illustrate delays and/or measurement errors associated with the start signal 466, the stop signal 468, etc. FIG. 6 can further illustrate signal flows along different paths/iterations during the initialization process.

The electronic device 400 of FIG. 4 can generate the start signal 466 and/or the stop signal 468 from the clock reference signal 471 of FIG. 4. For generating the stop signal 468, the electronic device 400 can generate based on the clock reference signal 471 after the after-lock timing 442 (e.g., a multiple periods of the clock reference signal 471 (NICK)). The electronic device 400 can apply positive and negative delay trims (e.g., tREF and tFB from the trim circuit 532) to the clock reference signal 471.

The electronic device 400 can generate the start signal 466 based on the intrinsic delay 448 of FIG. 4, the model delay 452 of FIG. 4, the feedback trim 584 (tFB), the latch duration 586 (tLatch), the measurement duration 588 (tMeas), etc. The electronic device 400 can generate the stop signal 468 based on the reference trim 582 (tREF), the after-lock timing 442 (NICK) or a multiple periods of the clock reference signal 471, the latch duration 586 (tLatch), the strobe duration 594 (tStrb), etc. The measured duration between the start signal 466 and the stop signal 468 can be based on removing the intrinsic delay 448 and the model delay 452 from the multiple periods of the clock reference signal 471. For example, the measured duration between the start signal 466 and the stop signal 468 (e.g., a coarse delay code) can be represented as:

$$\text{STOP}-\text{START}=N \cdot t\text{CK}-t\text{ID}-t\text{Model}. \qquad \text{Equation (3)}.$$

The measurement error value (e.g., error in the measured duration between the start signal 466 and the stop signal 468) can be represented as:

$$\text{ERROR}=(t\text{REF}+t\text{Strb})-(t\text{FB}+t\text{Meas}). \qquad \text{Equation (4)}.$$

In some embodiments, the reference trim 582 can correspond to (e.g., such as by having equal durations) the feedback trim 584. In some embodiments, the measurement duration 588 can correspond to (e.g., such as by having equal durations) the strobe duration 594. The error can be minimized by trimming the delay mismatch between them.

Figure 7:
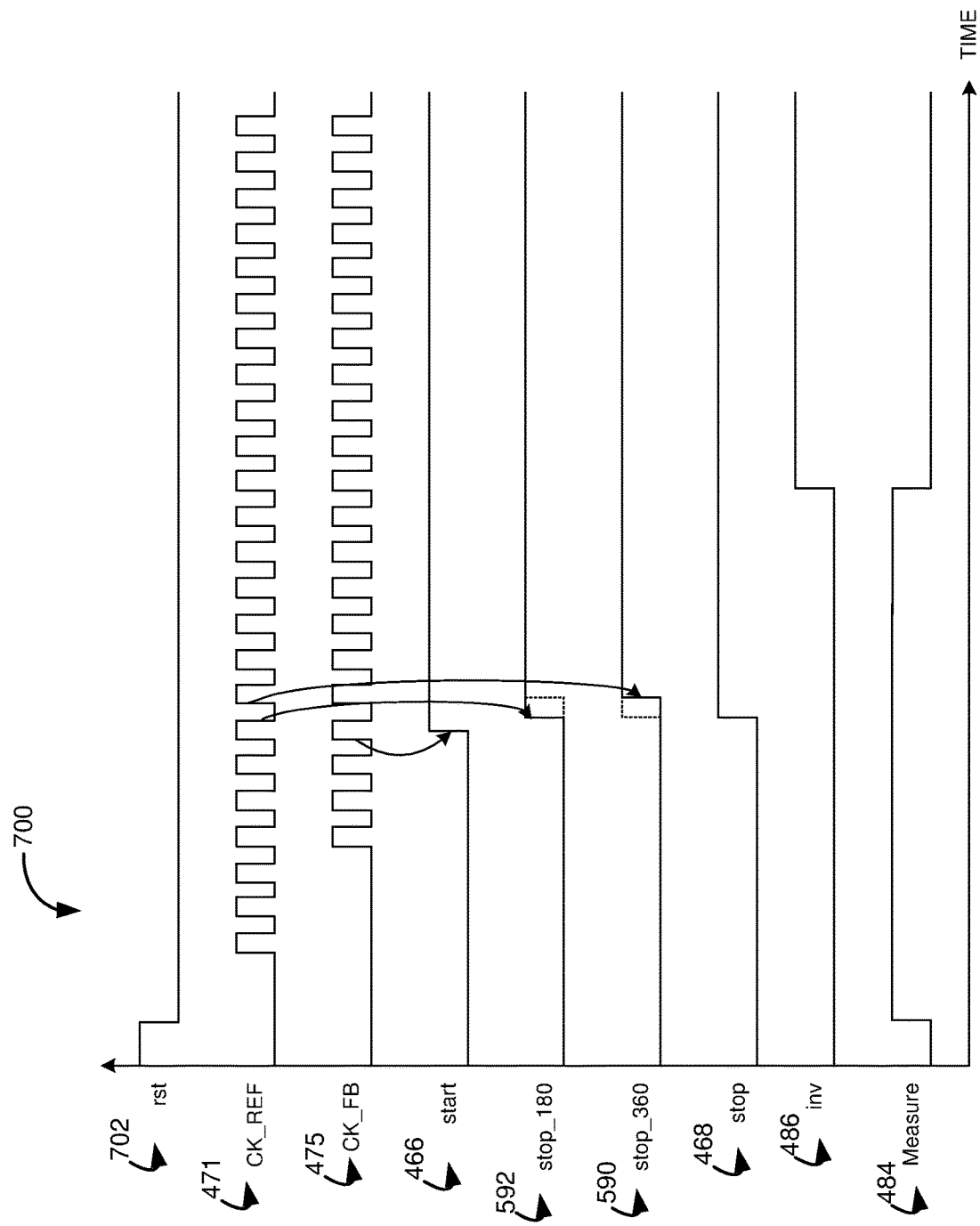
FIG. 7 illustrates a timing diagram for a DLL initialization in accordance with an embodiment of the present technology.

FIG. 7 illustrates a timing diagram 700 for a DLL initialization in accordance with an embodiment of the present technology. The timing diagram 700 can illustrate a relationship between signals, such as the clock reference signal 471, the model delayed signal 475, the start signal 466, the synced-internal stop 590 (STOP_360), the inverted-internal stop 592 (STOP_180), the stop signal 468, the inversion-decision signal 486, the measure signal 484, etc.

As an initial condition, the clock enable 482 and/or the inversion-decision signal 486 can be initialized as '0' or low to select the first path (e.g., non-inversion signal path). Also, the delay code can be set to '0' or low to calibrate out the intrinsic delay 448 in the forward clock path. The initialization process can start when the DLL is enabled and a reset signal 702 is released.

Based on the reset signal 702, the clock reference signal 471 can become enabled/active. The clock reference signal 471 can start/initiate the timing counter 430 of FIG. 4 (e.g., N-measure counter), generate the start signal 466, set the clock enable 482 high, etc. Also, the reaction/responses (e.g., setting the clock enable 482 high) to the clock reference signal 471 can enable the clock reference signal 471 to travel along the variable delay circuit 406 of FIG. 4. The electronic device (e.g., the electronic device 400/400 or an initialization control logic therein) can wait until the stop signal 468 arrives, at which time, the coarse delay code and N-measure counter values can be determined and stored. The whole initialization time can be controlled by a measurement counter, and the initialization can be done when the counter is full. Accordingly, the DLL can set the inverse-decision value and load saved coarse delay code.

As illustrated in FIG. 7, the start signal 466 can be triggered by the model delayed signal 475, such as after a period of delay or a number of cycles (e.g., as illustrated in FIG. 6). Once the start signal 466 is triggered, the following edges of the clock reference signal 471 can trigger the internal stop signals. For example, the falling edge of the clock reference signal 471 can trigger the inverted-internal stop 592, and the rising edge of the clock reference signal 471 can trigger the synced-internal stop 590. Of the two internal stop signals, the first arriving one (e.g., the inverted-internal stop 592 for the scenario illustrated in FIG. 7) can trigger the stop signal 468. With the stop signal 468 enabled, changes in the measure signal 484 (e.g., transitioning low) can trigger the inversion-decision signal 486.

Figure 8:
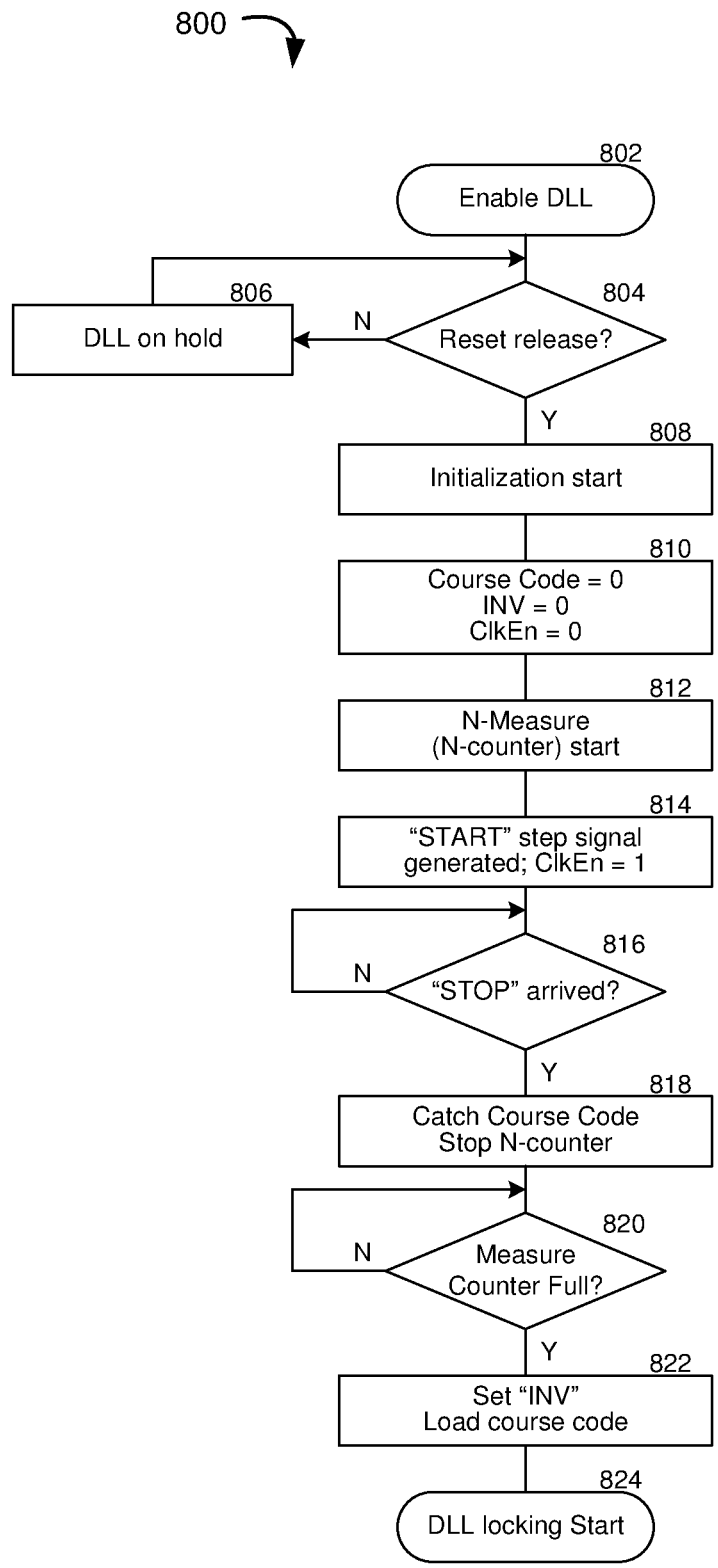
FIG. 8 illustrates an example method of operating an electronic system in accordance with embodiments of the present technology.

FIG. 8 illustrates an example method 800 of operating an electronic system (e.g., the electronic device 400 of FIG. 4 and/or the electronic device 500 of FIG. 5) in accordance with embodiments of the present technology. The method 800 can be for initializing the DLL. For example, the method 800 can include calculating a coarse code (e.g., a delay duration between transition edges in a signal) and the inversion-decision signal 486 of FIG. 4.

At block 802, the DLL can be enabled. Until a reset signal is released, the DLL can be placed on hold, such as represented by decision block 804 and block 806. At block 808, when the reset signal is released, the electronic device can begin initialization process.

At block 810, the electronic device can access initial values for the initialization process. In some embodiments, the electronic device can access stored initial values. In some embodiments, the electron device can reset one or more parameters to an initial value. For example, the electronic device can set the coarse code, the inversion-decision signal 486, the clock enable 482 of FIG. 4, etc. to '0' in beginning the initialization process.

At block 812, the electronic device can allow the input signal 462 of FIG. 4 to propagate through the initialization circuit, thereby generating the model delayed signal 475 as discussed above. Also, the electronic device can start the timing counter 430 of FIG. 4 (e.g., the N-measure counter) based on the model delayed signal 475 or a processing result thereof (e.g., the START0 signal).

At block 814, the electronic device can generate the start signal 466 of FIG. 4 based on the model delayed signal 475. For example, the electronic device can generate the start signal 466 based on trimming (e.g., by tFB), latching, buffering, etc. for the model delayed signal 475 as discussed above. Also, the electronic device can set the clock enable 482 (e.g., high or '1') based on generating the start signal 466.

At decision block 816, the electronic device can wait until the stop signal 468 is generated. For example, following the generating of the start signal 466, the electronic device can generate the inverted-internal stop 592 of FIG. 5 and the synced-internal stop 590 of FIG. 5 based on the clock reference signal 471. As discussed above, the electronic device can generate the inverted-internal stop 592 based on a falling edge of the clock reference signal 471 that occurs after the start signal 466. Also, the electronic device can generate the synced-internal stop 590 based on a rising edge. The electronic device can generate the stop signal 468 according to either the inverted-internal stop 592 or the synced-internal stop 590 that occurs first.

At block 818, the electronic device can stop the various time measurements. For example, based on the stop signal 468, the electronic device can calculate the coarse code (e.g., a duration between the start signal 466 and the stop signal 468) and/or stop the timing counter 430.

At decision block 820, the electronic device can wait until the measure counter is full (e.g., until the measure/initialization signal goes low as illustrated in FIG. 7). When the measure counter is full, such as at block 822, the electronic device can load the coarse code for the DLL. Also, at block 822, the electronic device can load the inversion-decision signal 486 for the DLL. The electronic device can generate the inversion-decision signal 486 based on sampling the inverted-internal stop 592 at a rising edge of the synced-internal stop 590, and then resynchronizing the sampling result to the clock reference signal 471 as discussed above. At block 826, the electronic device can begin the DLL locking process using the loaded coarse code and the inversion-decision signal 486. During the DLL locking process, the electronic device can make finer adjustments for the DLL to generate the output signal 464.

The inversion-decision circuit 560 generating the inversion-decision signal 486 based on the clock reference signal 471 and the two internal stop signals, and using the inversion-decision signal 486 to invert or maintain the incoming signal at the second input selector 504 allows the clock inversion feature to be added to the DLL and determined during initialization. The resulting process/circuit can allow the same circuit/initialization to make the inversion decision as well as initialization of the DLL. Making the decision to invert the incoming signal using the same initialization circuit provides at least reduced complexity, lowered design risk, reduced locking time, increased fidelity in producing the shortest delay line length, and reduced power.

Figure 9:
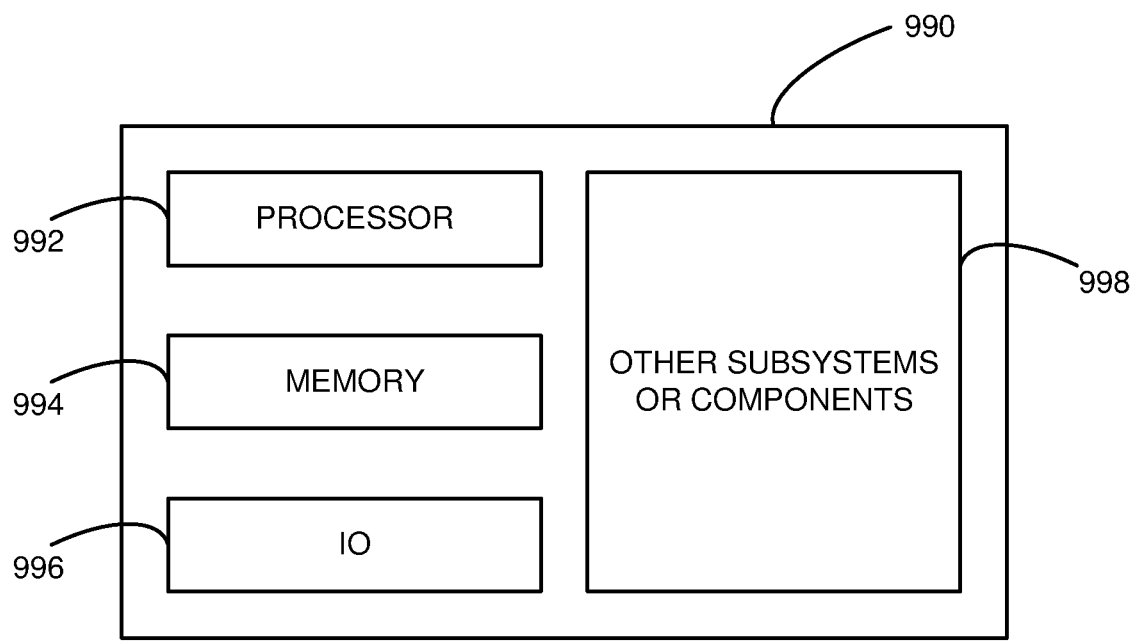
FIG. 9 is a schematic view of a system that includes an electronic device in accordance with embodiments of the present technology.

FIG. 9 is a schematic view of a system that includes an electronic device in accordance with embodiments of the present technology. Any one of the semiconductor devices having the features described above with reference to FIGS. 2-8 can be incorporated into any of a myriad of larger and/or more complex systems, a representative example of which is system 990 shown schematically in FIG. 9. The system 990 can include a processor 992, a memory 994 (e.g., SRAM, DRAM, flash, and/or other memory devices), input/output devices 996, and/or other subsystems or components 998. The semiconductor assemblies, devices, and device packages described above with reference to FIGS. 2-8 can be included in any of the elements shown in FIG. 9. The resulting system 990 can be configured to perform any of a wide variety of suitable computing, processing, storage, sensing, imaging, and/or other functions. Accordingly, representative examples of the system 990 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 990 include lights, cameras, vehicles, etc. With regard to these and other examples, the system 990 can be housed in a single unit or distributed over multiple interconnected units, e.g., through a communication network. The components of the system 990 can accordingly include local and/or remote memory storage devices and any of a wide variety of suitable computer-readable media.

The term "processing" as used herein includes manipulating signals and data, such as writing or programming, reading, erasing, refreshing, adjusting or changing values, calculating results, executing instructions, assembling, transferring, and/or manipulating data structures. The term data structures include information arranged as bits, words or code-words, blocks, files, input data, system generated data, such as calculated or generated data, and program data.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-9.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. An electronic device, comprising:
   a delay circuit configured to adjust a delay of an input for generating an output signal; and
   an input selector circuit coupled to the delay circuit, the input selector circuit configured to generate the input based on selecting either a clock input or an inverted signal at least in part according to a timing associated with the delay circuit and/or another circuit within the electronic device,
   wherein the clock input is used to generate the input, and
   wherein the inverted signal is an inverted form of the clock input.

2. The electronic device of claim 1, wherein the input selector circuit includes an input selector configured to generate the clock input based on selecting from an input signal set including a clock reference signal or a start signal that is used for measuring a delay associated with the timing.

3. The electronic device of claim 1, wherein the input selector circuit includes an inverting selector configured to send either clock input or an inverted signal as the input.

4. The electronic device of claim 3, wherein the inverting selector is a multiplexer configured to:
   receive the start-enabled signal and the inverted form of the start-enabled signal as the inverted signal; and
   send either the start-enabled signal or the inverted signal according to the timing.

5. The electronic device of claim 1, wherein the electronic device comprises a delay locked loop (DLL), the DLL further comprising:
   an input buffer coupled to the input selector circuit, the input buffer configured to generate a clock reference signal based on an input signal received from a source outside of flail the DLL, wherein the clock reference signal is an input to the input selector circuit; and
   a decision circuit coupled to the delay circuit and the input selector circuit, the decision circuit configured to generate an inversion-decision signal based at least in part on the measurement of the delay, wherein the decision circuit includes
      a trim circuit coupled to the input buffer, the trim circuit configured to generate a trimmed reference signal based on trimming the clock reference signal.

6. The electronic device of claim 1, further comprising:
   a decision circuit coupled to the delay circuit and the input selector circuit, the decision circuit configured to generate an inversion-decision signal based at least in part on a measurement of a delay corresponding to the delay circuit, wherein the decision circuit includes
      a first circuit configured to generate a synced-internal stop synchronized with the clock reference signal, and
      a second circuit configured to generate an inverted-internal stop that is phase offset 180° from the clock reference signal; and
   wherein
   the input selector circuit is configured to control the phase based on the inversion-decision signal.

7. The electronic device of claim 6, wherein:
   the first circuit includes, a first multiplexer and a first latch configured to generate the synced-internal stop based on a rising edge of the clock reference signal; and
   the second circuit includes, a second multiplexer and a second latch configured to generate the inverted-internal stop based on a falling edge of the clock reference signal.

8. The electronic device of claim 7, wherein the decision circuit further includes a stop generator coupled to the first circuit and the second circuit, the stop generator configured to generate the stop signal according to either the synced-internal stop or the inverted-internal stop that arrives first at a stop decision mechanism.

9. The electronic device of claim 8, wherein the stop decision mechanism is an OR gate.

10. The electronic device of claim 7, wherein the decision circuit further includes an inversion-decision circuit comprising:
    a decision timing circuit coupled to the first circuit and the second circuit, the decision timing circuit configured to sample and resynchronize the inverted-internal stop; and
    an inversion decision mechanism coupled to the decision timing circuit, the inversion decision mechanism configured to generate the inversion-decision signal based on an output of the decision timing circuit.

11. The electronic device of claim 10, wherein the decision timing circuit is configured to:
    generate a first internal output based on sampling the inverted-internal stop at a rising edge of the synced-internal stop; and
    generate a second internal output based on synchronizing the first internal output with the clock reference signal.

12. The electronic device of claim 11, wherein the decision timing circuit includes:
    a first flip-flop configured to generate the first internal output; and
    a second flip-flop configured to generate the second internal output.

13. The electronic device of claim 10, further comprising:
    an initialization logic configured to generate a measure signal representing a duration of measurement phase; and
    wherein:
    the inversion decision mechanism is configured to generate the inversion-decision signal based an output of the decision timing circuit, wherein the output is released when measurement is done.

14. The electronic device of claim 13, wherein the inversion decision mechanism includes an AND gate configured to generate the inversion-decision signal based on the measure signal and the output of the decision timing circuit.

15. The electronic device of claim 6, wherein:
    the trim circuit is further configured to generate a trimmed feedback signal based on trimming a model delayed signal; and
    the decision circuit includes a start generator configured to generate a start signal based on the trimmed feedback signal, wherein the start signal is used to begin measurement of a coarse delay representative of the initial timing.

16. The electronic device of claim 15, wherein the start generator includes a start latch and a start buffer.

17. The electronic device of claim 15, wherein the start generator corresponds to the coarse delay that matches a strobe duration associated with a stop signal used to stop the measurement of the coarse delay.

18. The electronic device of claim 15, the electronic device comprising a dynamic random-access memory (DRAM).

19. A delay locked loop (DLL) initialization circuit, comprising:

an input selection circuit configured to generate a signal that either matches an input signal or is an inverse thereof;
a delay line coupled to the input selection circuit, the delay line configured to control a delay of the signal from the input selection circuit; and
wherein the input selection circuit is configured to generate the signal based on controlling a phase thereof according to a timing and/or a model of the delay line and/or another circuit within the electronic device.

20. The DLL initialization circuit of claim 19, wherein the input selection circuit includes a selection multiplexer configured to select either a start-enabled signal or an inverted signal to generate the signal, wherein the start-enabled signal is synchronized with the input signal and the inverted signal is an inverted form of the input signal.

21. The DLL initialization circuit of claim 19, further comprising:
a decision circuit coupled to the input selection circuit and the delay line, the decision circuit configured to generate an inversion decision signal based on the input signal for controlling the phase of the input signal, wherein the inversion decision signal is generated based on
a start signal and a stop signal generated based on the input signal and a feedback of a processing result of the input signal, wherein the start signal and the stop signal are for measuring a coarse delay used to provide an initial timing for the DLL; and
the decision circuit includes:
a first circuit configured to generate a synced-internal stop based on a rising edge of the clock reference signal following the start signal;
a second circuit configured to generate an inverted-internal stop based on a falling edge of the clock reference signal following the start signal;
an OR gate configured to generate the stop signal according to either the synced-internal stop or the inverted-internal stop that arrives first at the OR gate;
a set of flip-flops configured to sample the inverted-internal stop at a rising edge of the synced-internal stop and synchronize a sampled value with the clock reference signal; and
an AND gate configured to generate the inversion-decision signal according to on an output of the set of flip-flops and measure signal.

22. A method of operating an electronic device, the method comprising:
generating a clock reference signal based on an input clock signal from a source outside of a delay locked loop (DLL);
estimating an offset duration between transitions in the clock reference signal for generating an output signal; and
selecting either a clock input or an inverted signal according to the estimated offset duration, wherein:
the selected input or result is used as an input for generating the output signal,
the clock input is based on the clock reference signal, and
the inverted signal is an inverted form of the clock input.

23. The method of claim 22, further comprising generating the output signal from the input clock signal for the DLL according to the estimated offset duration.

24. The method of claim 23, wherein generating the output signal includes:
selecting, according to the estimated offset duration, either a signal synchronized with the clock reference signal or an inverted form of the clock reference signal; and
delaying the selected signal according to the estimated offset duration.

25. The method of claim 22, wherein:
estimating the offset duration includes:
generating a start signal based on a model delayed signal resulting from allowing the clock reference signal to initially travel through the electronic device or a portion thereof;
generating a stop signal based on a transition in the clock reference signal that occurs after generating the start signal, wherein generating the stop signal includes, after generating the start signal:
generating a synced-internal stop based on a rising edge of the clock reference signal,
generating an inverted-internal stop based on a falling edge of the clock reference signal, and
generating the stop signal based on either the synced-internal stop or the inverted-internal stop that occurs first; and
further comprising:
generating an inversion-decision signal according to the estimated offset duration,
wherein the inversion-decision signal controls the inversion, wherein generating the inversion-decision signal includes generating the inversion-decision signal according to a direction of the transition in the clock reference signal used to generate the stop signal.

26. The method of claim 25, wherein generating the inversion-decision signal includes:
sampling the inverted-internal stop at a rising edge of the synced-internal stop; and
resynchronizing a result of the sampling with the clock reference signal.

* * * * *